(12) United States Patent
Namkung

(10) Patent No.: US 11,256,297 B2
(45) Date of Patent: *Feb. 22, 2022

(54) DISPLAY DEVICE

(71) Applicant: Samsung Display Co., Ltd., Yongin-si (KR)

(72) Inventor: Jun Namkung, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/749,096

(22) Filed: Jan. 22, 2020

(65) Prior Publication Data

US 2020/0158918 A1    May 21, 2020

Related U.S. Application Data

(63) Continuation of application No. 14/715,681, filed on May 19, 2015, now Pat. No. 10,564,326.

(30) Foreign Application Priority Data

Sep. 24, 2014    (KR) .......................... 10-2014-0127747

(51) Int. Cl.
  *G06F 1/16*     (2006.01)
  *G02B 1/14*     (2015.01)
  (Continued)

(52) U.S. Cl.
  CPC ............. *G06F 1/1652* (2013.01); *G02B 1/04* (2013.01); *G02B 1/14* (2015.01); *G06F 3/0412* (2013.01); *G06F 3/0416* (2013.01); *H01L 51/5253* (2013.01); *G02F 2201/50* (2013.01); *G09G 3/32* (2013.01); *H01L 27/323* (2013.01);
  (Continued)

(58) Field of Classification Search
  CPC ................. G06F 3/0412; G06F 3/0416; G06F 2203/04102; G06F 2203/04103; G06F 1/1652; G09G 2300/04; G09G 2300/0404; G09G 3/32; G09G 2380/02; G02B 1/14; G02B 1/04; G02F 2201/50; H01L 51/0097; H01L 51/5253; H01L 51/5281;
  (Continued)

(56) References Cited

U.S. PATENT DOCUMENTS 6,753,847 B2    6/2004   Kurtenbach et al.
7,868,545 B2    1/2011   Hioki et al.
(Continued)

FOREIGN PATENT DOCUMENTS

KR    10-2011-0045296    5/2011
KR    10-2012-0003322    1/2012
(Continued)

*Primary Examiner* — Jason M Mandeville
(74) *Attorney, Agent, or Firm* — Kile Park Reed & Houtteman PLLC

(57) ABSTRACT

A display device includes a display panel having a bent shape with respect to a first bending axis and a second bending axis, the display panel emitting light upward, and the first and second bending axes intersect with each other, a polarizing plate on an upper surface of the display panel and polarizing the light emitted upward, and a first protective film on a lower surface of the display panel, the first protective film including a plurality of first protrusion portions having three-dimensional shapes.

18 Claims, 7 Drawing Sheets

(51) Int. Cl.
  *G02B 1/04*  (2006.01)
  *G06F 3/041*  (2006.01)
  *H01L 51/52*  (2006.01)
  *H01L 51/00*  (2006.01)
  *H01L 27/32*  (2006.01)
  *G09G 3/32*  (2016.01)

(52) U.S. Cl.
  CPC ...... *H01L 51/0097* (2013.01); *H01L 51/5281* (2013.01); *H01L 2251/5315* (2013.01); *H01L 2251/5338* (2013.01)

(58) Field of Classification Search
  CPC ........... H01L 27/323; H01L 2251/5315; H01L 2251/5338
  USPC .............................................. 345/173, 76, 87
  See application file for complete search history.

(56) References Cited

U.S. PATENT DOCUMENTS

| | | | |
|---|---|---|---|
| 8,098,486 | B2 | 1/2012 | Hsiao et al. |
| 9,122,012 | B2 | 9/2015 | Cho |
| 9,152,289 | B2 | 10/2015 | Nishikawa et al. |
| 2006/0273304 | A1 | 12/2006 | Cok |
| 2006/0278333 | A1* | 12/2006 | Lee .................. G02F 1/133305 156/263 |
| 2008/0018631 | A1 | 1/2008 | Hioki et al. |
| 2008/0055831 | A1* | 3/2008 | Satoh .................. H05K 1/0281 361/600 |
| 2009/0256819 | A1 | 10/2009 | Jung |
| 2009/0284904 | A1 | 11/2009 | Wu et al. |
| 2014/0065367 | A1 | 3/2014 | Matsumoto et al. |
| 2014/0078582 | A1 | 3/2014 | Cho |
| 2014/0091288 | A1 | 4/2014 | Lee et al. |
| 2014/0118269 | A1* | 5/2014 | Kim ...................... G06F 3/0445 345/173 |
| 2015/0024170 | A1* | 1/2015 | Min ....................... B32B 3/263 428/172 |
| 2015/0086740 | A1* | 3/2015 | Shin .................... B32B 37/0076 428/41.8 |
| 2016/0037625 | A1 | 2/2016 | Huitema et al. |

FOREIGN PATENT DOCUMENTS

| | | |
|---|---|---|
| KR | 10-2012-0041395 | 5/2012 |
| KR | 10-2012-0069485 | 6/2012 |
| KR | 10-2013-0106731 | 9/2013 |
| KR | 10-2014-0055685 | 5/2014 |
| KR | 10-2015-0043647 | 4/2015 |

* cited by examiner

DISPLAY DEVICE

CROSS-REFERENCE TO RELATED APPLICATION

This is a continuation application based on currently pending U.S. patent application Ser. No. 14/715,681, filed on May 19, 2015, the disclosure of which is incorporated herein by reference in its entirety. U.S. patent application Ser. No. 14/715,681 claims priority benefit of Korean Patent Application No. 10-2014-0127747, filed on Sep. 24, 2014 in the Korean Intellectual Property Office, the disclosure of which is incorporated herein by reference in its entirety for all purposes.

BACKGROUND

1. Field

The present disclosure herein relates to a display device, and more particularly, to an organic light-emitting display device including an organic light-emitting diode.

2. Description of the Related Art

An organic light-emitting display device is a display device including an organic light-emitting diode (OLED). The OLED is a self light-emitting-type element, which needs no separate light source, and thus the OLED is superior in terms of response speed, viewing angle, and contrast ratio, as well as power consumption.

An organic light-emitting display device includes a plurality of pixels, such as red pixels, blue pixels, green pixels, white pixels, etc., and may express full color by combining these pixels. Each pixel includes an organic light emitting element and a plurality of thin-film transistors for driving the element.

An organic light-emitting element of an organic light-emitting display device includes a pixel electrode, a common electrode, and a light-emitting layer located between the two electrodes. One electrode of the pixel electrode and the common electrode becomes an anode electrode and the other becomes a cathode electrode. An electron injected from the cathode electrode and a hole injected from the anode electrode combine to form an exciton, and the exciton emits light with energy. The common electrodes are formed over a plurality of pixels and may transfer a constant common voltage. In the case of an organic light-emitting display device, a polarizing plate may be provided on an upper surface of a display panel to reduce the reflection of incident light from the outside, or a touch panel may be provided on the upper surface of the display panel to detect external contact, or a lower protective film may be provided on a lower surface of the display panel to prevent damage to the display panel.

SUMMARY

A display device according to an embodiment may include a display panel having a bent shape with respect to a first bending axis and a second bending axis, the display panel emitting light upward, and the first and second bending axes intersect with each other, a polarizing plate on an upper surface of the display panel and polarizing the light emitted upward, and a first protective film on a lower surface of the display panel, the first protective film including a plurality of first protrusion portions having three-dimensional shapes.

The first protrusion portions may be formed on at least one surface of an upper surface and a lower surface of the first protective film.

The display panel may have a dome shape.

When the display panel has a convex dome shape bent upward with respect to the first and second bending axes, the first protrusion portions may be formed on the lower surface of the first protective film.

When the display panel has a concave dome shape bent downward with respect to the first and second bending axes, the first protrusion portions may be formed on the upper surface of the first protective film.

The first protrusion portions may be arranged in a first direction parallel to the first bending axis and a second direction parallel to the second bending axis.

The first protrusion portions may be formed to be spaced apart from each other.

The first protrusion portions may have one three-dimensional shape from among a sphere, a semi-sphere, a rectangular cylinder, a triangular cylinder, a circular cylinder, a triangular pyramid, a cone and a hexagonal pyramid.

The display panel may include an organic light-emitting element.

The first protective film may include polyethyleneterephthalate (PET), polyetylenenaphthalate, polycarbonate, polyarylate, polyetherimide, polyethersulphone or polyimide.

The display device may further include a touch-screen panel located on an upper surface of the polarizing film and sensing a touch input.

The touch-screen panel may include a second protective film including a second protrusion portions having three-dimensional shapes.

The second protrusion portions may be formed on at least one surface of an upper surface and a lower surface of the second protective film.

The second protrusion portions may be arranged in a first direction parallel to the first bending axis and a second direction parallel to the second bending axis.

The second protrusion portions may have one three-dimensional shape from among a sphere, a semi-sphere, a rectangular cylinder, a triangular cylinder, a circular cylinder, a triangular pyramid, a cone and a hexagonal pyramid.

The display device may further include an adhesive film for attaching the display panel and the first protective film.

The adhesive film may be a film having a plurality of grooves having three-dimensional shapes.

The grooves may be formed on at least one surface of an upper surface and a lower surface of the adhesive film.

The grooves may be arranged in a first direction parallel to the first bending axis and a second direction parallel to the second bending axis.

The grooves may have one three-dimensional shape from among a sphere, a semi-sphere, a rectangular cylinder, a triangular cylinder, a circular cylinder, a triangular pyramid, a cone and a hexagonal pyramid.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
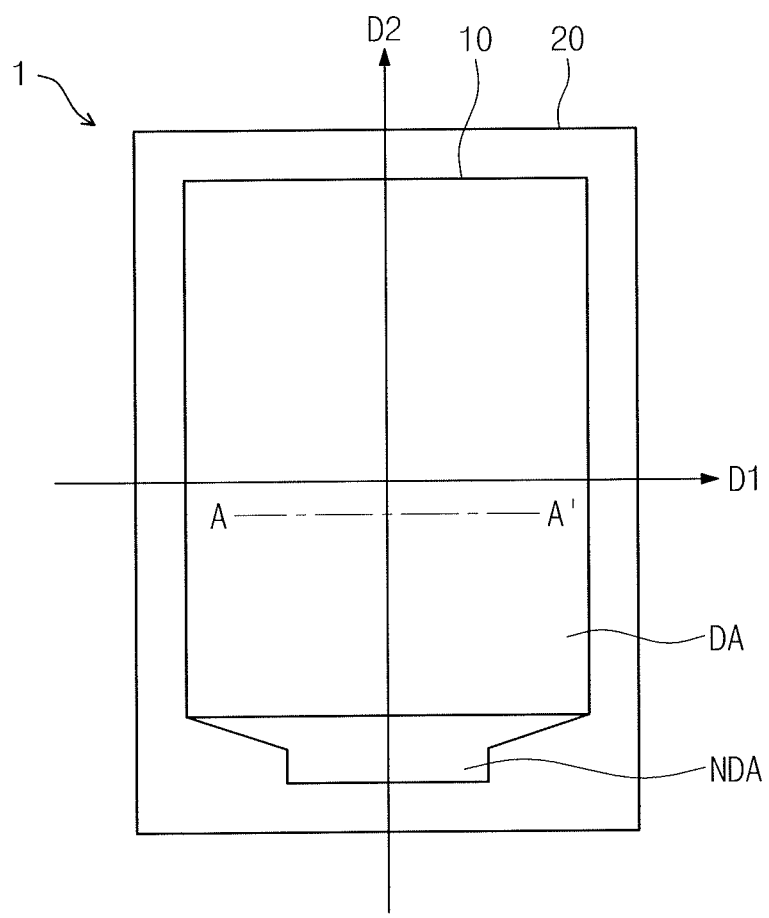
FIG. 1A illustrates a front view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments ae provided so that this disclosure will be thorough and complete, and will fully convey exemplary implementations to those skilled in the at.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Although the terms used in this specification are selected, as much as possible, from general terms that are widely used at present while taking into consideration functions obtained in accordance with one embodiment, these terms may be replaced by other terms based on intensions of those skilled in the art, customs, emergence of new technologies, or the like. Also, in a particular case, terms that are arbitrarily selected by the applicant may be used. In this case, meanings of these terms may be disclosed in corresponding description parts of the embodiments. Accordingly, it should be noted that the terms used herein should be construed based on practical meanings thereof and the whole content of this specification, rather than being simply construed based on names of the terms.

Figure 1B:
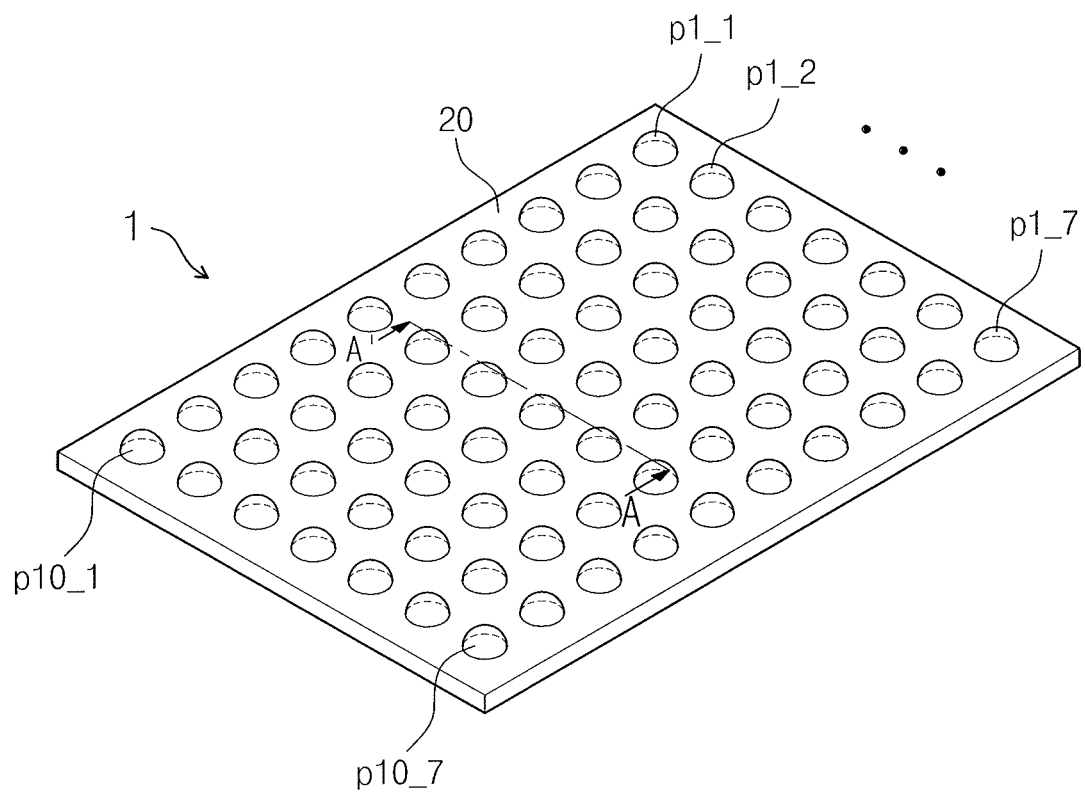
FIG. 1B illustrates a rear perspective view of a display device according to an exemplary embodiment.

FIGS. 1A and 1B illustrate a front view and rear perspective view, respectively, of a display device according to an exemplary embodiment.

Figure 2:
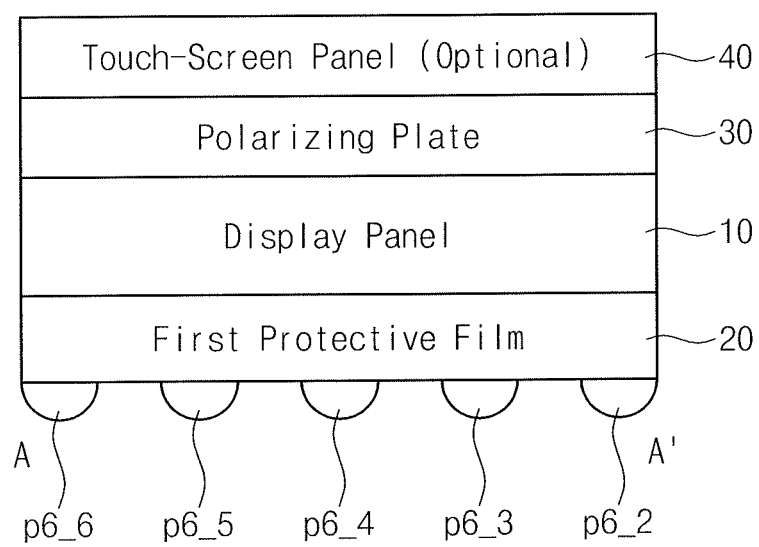
FIG. 2 illustrates a schematic cross-sectional view of the display device of FIG. 1 taken along line A-A'.

Referring to FIG. 1A, a display device 1 may include a display panel 10 for emitting light, a first protective film 20 for protecting the display panel 10, and a polarizing plate for polarizing light 30 (FIG. 2). The display panel 10 may include a display area DA and a non-display area NDA.

In the display area DA of the display panel 10, a plurality of pixels emitting light and a plurality of signal lines for transmitting driving signals to the pixels may be disposed. The pixels receive a plurality of gate signals and a plurality of data signals through the signal lines, and emit light corresponding to the received gate signals and data signals. Here, the pixels may include an organic light-emitting diode (OLED).

In the non-display area NDA of the display panel 10, a plurality of drive circuits and a plurality of signal lines for transmitting driving signals to the pixels of the display area DA may be disposed. The drive circuits may transmit a plurality of gate signals and a plurality of data signals to the pixels of the display area DA through the signal lines.

The display panel 10 serves as a base substrate for disposing the above-mentioned structures and may include a flexible plastic substrate. That is, the display panel 10 may include a plurality of pixels, a plurality of signal lines, and a plurality of drive circuits on the flexible plastic substrate. The flexible plastic substrate may include, e.g., polyethylenetherephthalate (PET), polyetylenenaphthalate, polycarbonate, polyarylate, polyetherimide, polyethersulphone, polyimide, etc.

When a base substrate of the display panel 10 is a flexible plastic substrate, the shape of the display panel 10 may be deformed by an external force. That is, the display panel 10 may be bent or folded by an external force. This specification relates to a stress alleviation structure of a bendable display panel 10, and the display panel that will be described below denotes a display panel 10 which may be bent with respect to a predetermined bending axis.

The display panel 10 may be bent with respect to first and second bending axes D1 and D2, wherein the first and second bending axes D1 and D2 denote bending axes intersecting with each other. As the display panel 10 is simultaneously bent with respect to the first and second bending axes D1 and D2, the display panel 10 may be deformed into a dome shape. When the display panel 10 maintains a dome shape, elements prepared in the display panel 10 may be stressed so as to be damaged. To prevent the damage, the display device 1 may include the first protective film 20 with a plurality of first protrusion portions, e.g., first protrusion portions p1_1 to p10_7, in one surface thereof, as will be described in more detail below with reference to FIG. 1B.

Although not shown in FIGS. 1A and 1B, the polarizing plate 30 (FIG. 2) may be disposed on an upper surface of the display panel 10. The polarizing plate 30 may polarize an upwardly incident light from the display panel 10. The polarizing plate 30 may be formed of a transparent material and may have a reflection protection pattern in one surface thereof for preventing reflection of the incident light from the outside.

As illustrated in FIG. 2, the first protective film 20 may be disposed on a lower surface of the display panel 10 to prevent damage to the display panel 10, e.g., the display panel 10 may be between the first protective film 20 and the polarizing plate 30. The first protective film 20 may include a material with a high hardness to protect the display panel 10 from an external shock. For example, the first protective film 20 may include polyethylenetherephthalate (PET), polyetylenenaphthalate, polycarbonate, polyarylate, polyetherimide, polyethersulphone, polyimide, etc. That is, the first protective film 20 may be formed of a material which is the same as or different from that of the base substrate of the display panel 10.

In detail, referring to FIG. 1B, the first protective film 20 may include the plurality of first protrusion portions, e.g., first protrusion portions p1_1 to p10_7. The first protrusion portions p1_1 to p10_7 may be formed on at least one surface of the upper and lower surfaces of the first protective film 20. For example, as illustrated in FIG. 1B, the first protrusion portions p1_1 to p10_7 may be formed at equal distances from each other along two directions to overlap a majority of the lower surface of the first protective film 20. FIG. 1B is a rear perspective view of the display device 1 illustrating the first protrusion portions p1_1 to p10_7 formed on the lower surface of the first protective film 20.

As the first protective film 20 has the first protrusion portions p1_1 to p10_7 formed in one surface thereof, damage to the elements included in the display panel 10 may be prevented by alleviating stress exerted on the display panel 10 caused by bending of the display panel 10. Also, as the first protective film 20 has the first protrusion portions p1_1 to p10_7 formed in one surface thereof, a crease or a curve on the surface of the display panel 10 (during bending of the display panel 10 along the first and second bending axes D1 and D2) may be prevented. More detailed descriptions thereof will be given below with reference to FIGS. 3 and 4.

The first protrusion portions p1_1 to p10_7 may have various three-dimensional shapes. For example, the first protrusion portions p1_1 to p10_7 may be spheres, semi-spheres, rectangular cylinders, triangular cylinders, circular cylinders, triangular pyramids, cones, hexagonal pyramids, etc. For example, as illustrated in FIG. 1B, the display device 1 may include semi-spherically shaped first protrusion portions p1_1 to p10_7. Hereinafter, only for convenience of description, the first protrusion portions p1_1 to p10_7 of the display device 1 are described and referred to as semi-spherical.

As the first protrusion portions p1_1 to p10_7 are formed in a three-dimensional shape, the generation of a surface crease and damage of elements caused by stress may be prevented even though the display panel 10 is bent with respect to any bending axis. For example, when the display panel 10 is bent with respect to the first and second bending axes D1 and D2 and forms a dome shape, the generation of surface creases in the display panel 10 and damage to elements in the display panel 10 caused by stress may be prevented or substantially minimized. This is because stress exerted from various directions may be alleviated since the first protrusion portions p1_1 to p10_7 are formed in three-dimensional shapes. Therefore, an effect is achieved such that the display panel 10 including solid-type first protrusion portions p1_1 to p10_7 may be bent in various directions, e.g., a vertical-horizontal direction, lateral-longitudinal direction, diagonal direction, etc.

Referring to FIG. 2, the first protrusion portions p1_1 to p10_7 may be arranged in a regular or an irregular manner on the first protective film 20. For example, when arranged in a regular manner, the first protrusion portions p1_1 to p10_7 may be arranged in a first direction parallel to the first bending axis D1 and a second direction parallel to the second bending axis D2. The first protrusion portions p1_1 to p10_7 thus arranged may form a plurality of rows and a plurality of columns, i.e., a matrix pattern, on the first protective film 20.

In addition, the first protrusion portions p1_1 to p10_7 may be formed to be adjacent to each other, e.g., and contact each other, or to be spaced apart from each other. For example, when the first protrusion portions p1_1 to p10_7 are formed to be spaced apart from each other, a predetermined vacant space may exist between the first protrusion portions p1_1 to p10_7, e.g., each first protrusion portion of the first protrusion portions p1_1 to p10_7 may be spaced apart from an adjacent first protrusion portion along two perpendicular directions. In another example, when the first protrusion portions p1_1 to p10_7 contact each other, a predetermined vacant space may exist between the first protrusion portions p1_1 to p10_7 due to the solid shapes of the first protrusion portions p1_1 to p10_7, e.g., the semi-spherical shape of each first protrusion portion of the first protrusion portions p1_1 to p10_7 defines a space between two curvatures contacting each other. Therefore, as the display panel 10 is bent, the first protrusion portions p1_1 to p10_7 may converge to the vacant space formed between the first protrusion portions p1_1 to p10_7, and as a result, stress exerted on the display panel 10 may be alleviated. More detailed descriptions thereof will be given below with reference to FIGS. 3A and 3B.

FIG. 2 illustrates a cross-sectional view of the display device of FIG. 1 taken along line A-A' according to an exemplary embodiment.

Referring to FIG. 2, the display device 1 may include the polarizing plate 30 on the upper surface, and the first protective film 20 on the lower surface with respect to display panel 10. That is, the display device 1 may have a structure in which the first protective film 20, the display panel 10, and the polarizing plate 30 are successively stacked one after another. Three-dimensionally-shaped first protrusion portions p6_2 to p6_6 may be formed on the bottom surface of the first protective film 20, e.g., the first protective film 20 may be between the display panel 10 and the first protrusion portions p6_2 to p6_6. Since the display device 1 of FIG. 1 includes the first protrusion portions p6_2 to p6_6, the cross-section of the protrusion portions p6_2 to p6_6 may be a semi-circle, as illustrated in FIG. 2.

The display device 1 may further include a touch-screen panel 40 on the upper surface of the polarizing plate 30. The touch-screen panel 40 may sense a touch pressure on the display device 1. The touch-screen panel 40 may also include a second protective film for alleviating stress which may be exerted on the panel, and the second protective film may also include a plurality of protrusion portions as the first protective film 20. More detailed descriptions about the second protective film of the touch-screen panel 40 will be given below with reference to FIG. 6.

Figure 3A:
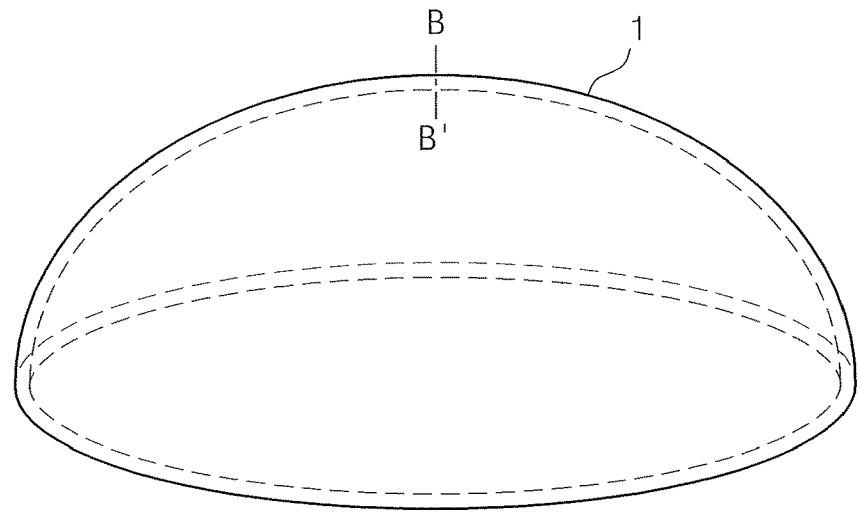
FIG. 3A illustrates a three-dimensional view of a display device having a convex dome shape according to an exemplary embodiment.
Figure 3B:
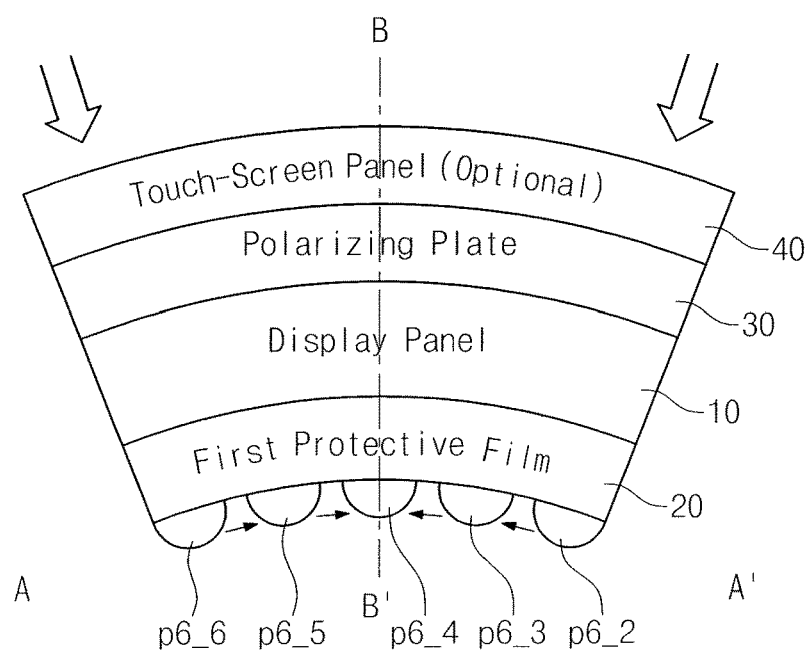
FIG. 3B illustrates a cross-sectional view of the display device of FIG. 3A taken along line B-B'.

FIG. 3A illustrates a three-dimensional view of a display device having a convex dome shape according to an exemplary embodiment. FIG. 3B is a cross-sectional view of the display device of FIG. 3A taken along line B-B' according to an exemplary embodiment.

Referring to FIG. 3A, when the display panel 10 is bent upward with respect to the first and second bending axes D1 and D2, the display device 1 may be formed in an upwardly convex dome shape. Here, the first and second bending axes D1 and D2 may be bending axes intersecting with each other at vertical angles.

Referring to FIG. 3B, when the display device 1 is formed in a convex dome shape, the first protrusion portions p6_2 to p6_6 may be formed on the lower surface of the first protective film 20. When the display panel 10 is bent into the dome shape of FIG. 3A, the first protrusion portions p6_2 to p6_6 formed on the lower surface of the display panel 10 converge to a vacant space located between the first protrusion portions p6_2 to p6_6, e.g., a distance between adjacent first protrusion portions p6_2 to p6_6 on a bent surface of the first protective film 20 may decrease, to alleviate the stress which may be exerted on the display panel 10.

Figure 4A:
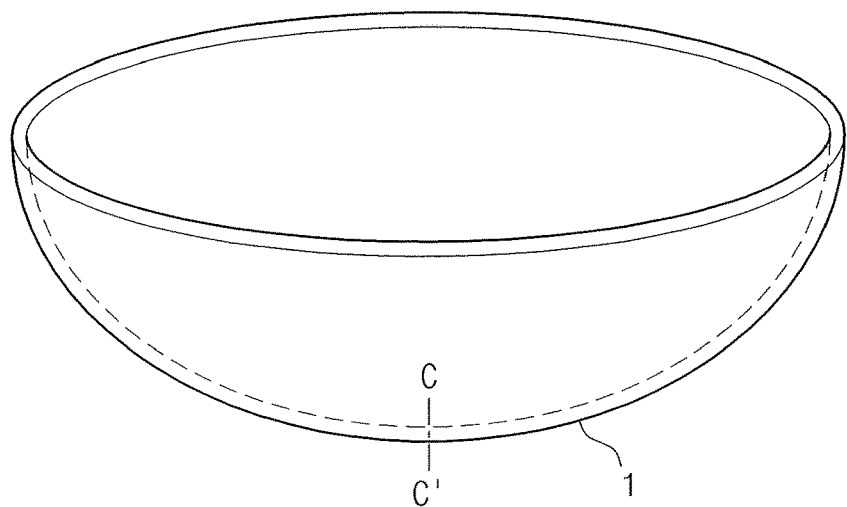
FIG. 4A illustrates a three-dimensional view of a display device having a concave dome shape according to an exemplary embodiment.
Figure 4B:
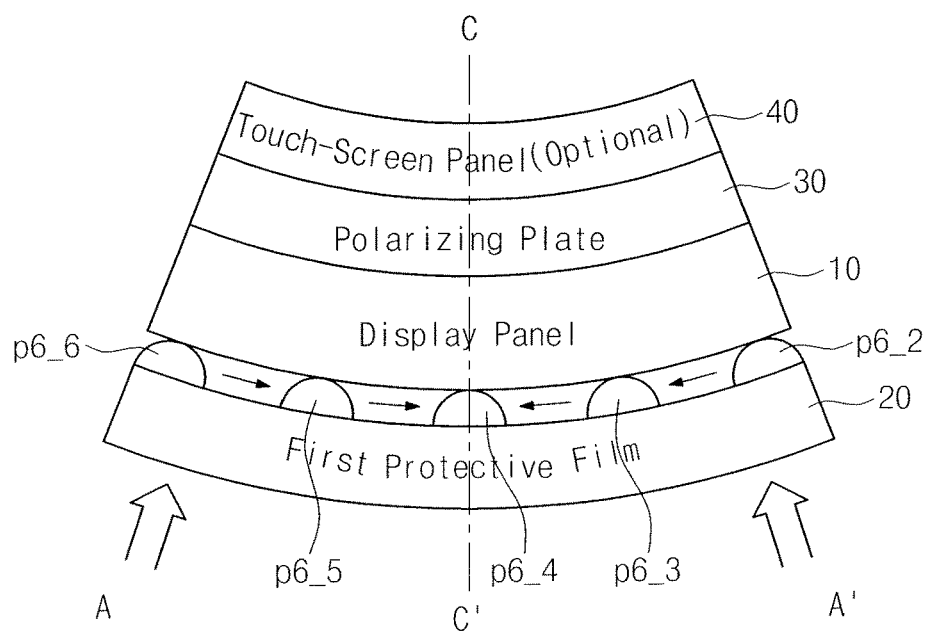
FIG. 4B illustrates a cross-sectional view of the display device of FIG. 4A taken along line C-C'.

FIG. 4A illustrates a three-dimensional view of a display device having a concave dome shape according to an exemplary embodiment. FIG. 4B is a cross-sectional view of the display device of FIG. 4A taken along line C-C' according to an exemplary embodiment.

Referring to FIG. 4A, when the display panel 10 is bent downward with respect to the first and second bending axes D1 and D2, the display device 1 may be formed in an upwardly concave dome shape. Here, the first and second bending axes D1 and D2 may be bending axes intersecting with each other at vertical angles.

Referring to FIG. 4B, when the display device 1 is formed in a concave dome shape, the first protrusion portions p6_2 to p6_6 may be formed on the upper surface of the first protective film 20, e.g., the first protrusion portions p6_2 to p6_6 may be between the display panel 10 and the first protective film 20. When the display panel 10 is bent downward, the first protrusion portions p6_2 to p6_6 formed on the upper surface of the display panel 10 converge to a vacant space located between the first protrusion portions p6_2 to p6_6 to alleviate the stress which may be exerted on the display panel 10.

Figure 5A:
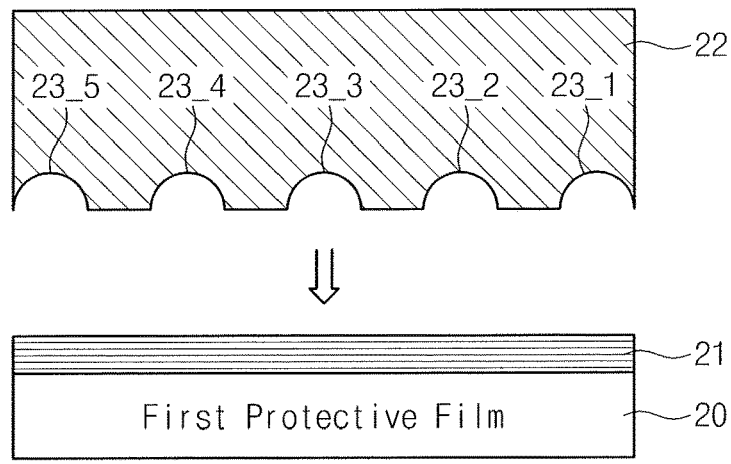
FIGS. 5A to 5C illustrate cross-sectional views of stages in a method for forming first protrusion portions according to an exemplary embodiment.
Figure 5B:
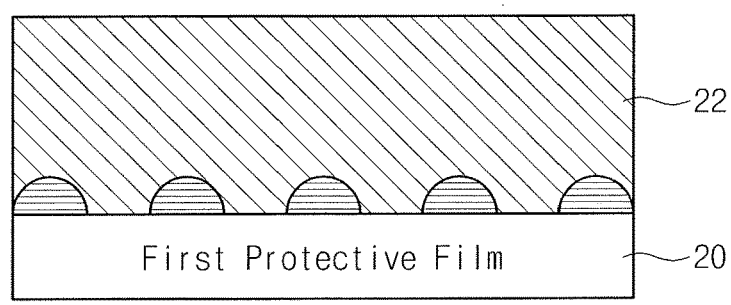
Figure 5C:
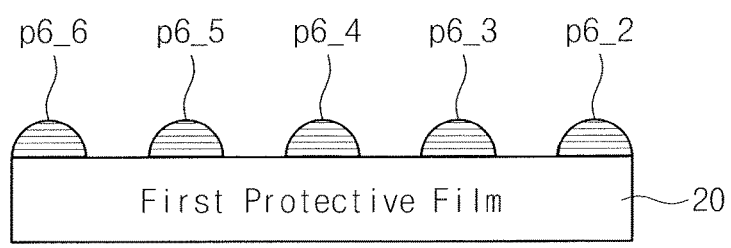

FIGS. 5A to 5C illustrate views of stages in a method for forming the first protrusion portions p6_2 to p6_6 according to an exemplary embodiment.

Referring to FIG. 5A, a specific material layer 21 is formed on the first protective film 20. The specific material layer 21 is a layer stacked on the first protective film 20 to form the first protrusion portions p6_2 to p6_6, and may include a material which is the same as or different from that of the first protective film 20. The specific material layer 21 may include, e.g., polyethylenetherephthalate (PET), polyetylenenaphthalate, polycarbonate, polyarylate, polyetherimide, polyethersulphone, polyimide, etc. To form the first protrusion portions p6_2 to p6_6 through an imprinting process, a mold substrate 22 may be disposed to face the first protective film 20. The mold substrate 22 may have a plurality of grooves 23_1 to 23_6 embossed in a convex three-dimensional shape.

Next, as illustrated in FIG. 5B, when the specific material layer 21 formed on one surface of the first protective film 20 is pressed by using the mold substrate 21, the first protrusion portions p6_2 to p6_6 may be formed on the first protective film 20. Then, as illustrated in FIG. 5C, when the mold substrate 22 is detached from the first protective film 20, the first protective film 20 with the first protrusion portions p6_2 to p6_6 formed thereon may be completely formed. In addition, the first protrusion portions p6_2 to p6_6 may be formed on the first protective film 20 using various patterning technology not limited to this embodiment.

Figure 6:
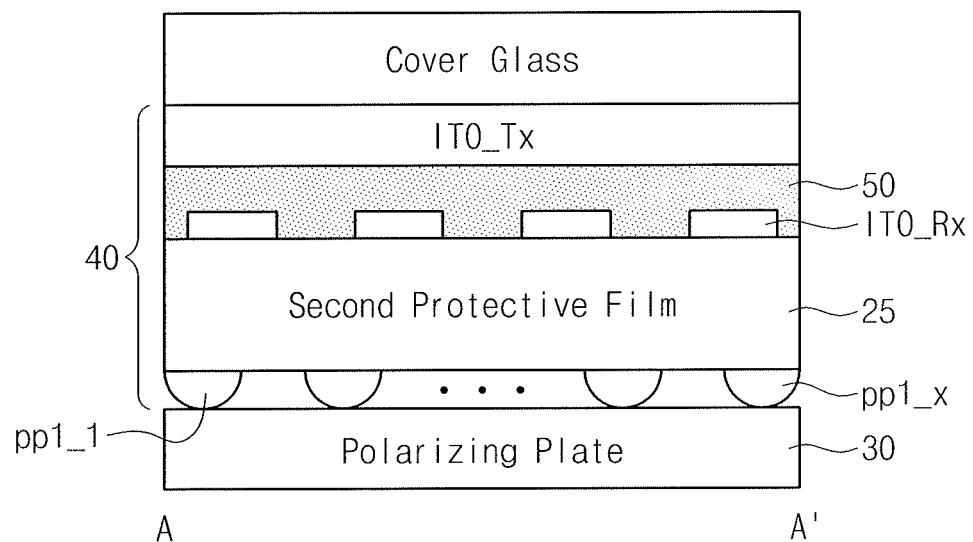
FIG. 6 illustrates a schematic cross-sectional view of a touch-screen panel including a second protective film having second protrusion portions according to an exemplary embodiment.

FIG. 6 illustrates a cross-sectional view of a touch-screen panel including a second protective film having second protrusion portions according to an exemplary embodiment.

Referring to FIG. 6, a touch-screen panel 40 is of an add-on type and may be disposed on the upper surface of the polarizing plate 30. The touch-screen panel 40 may include a second protective film 25, two transparent electrode layers ITO_Rx and ITO_Tx, and an adhesive film 50 for attaching the transparent electrode layers ITO_Rx and ITO_Tx.

For the second protective film 25 disposed on the touch-screen panel 40, the aforementioned description about the first protective film 20 may also be identically applied. Therefore, the second protective film 25 may also include a plurality of a second protrusion portions pp1_1 to pp1_x and the second protrusion portions pp1_1 to pp1_x may be formed on at least one of an upper surface and a lower surface of the second protective film 25. In addition, the second protrusion portions pp1_1 to pp1_x may be arranged in a first direction and a second direction parallel with the first and second bending axes D1 and D2, respectively. Furthermore, the second protrusion portions pp1_1 to pp1_x may have one three-dimensional shape from among a sphere, a semi-sphere, a rectangular cylinder, a triangular cylinder, a circular cylinder, a triangular pyramid, a cone and a hexagonal pyramid.

The touch-screen panel 40 may also include the second protective film 25 having the second protrusion portions pp1_1 to pp1_x, and thus damage of elements and surface creases of the touch screen panel 40, which may be caused by bending of the display panel 10, may be prevented.

Although only an add-on type touch screen 40 was described in the present embodiments, embodiments are not limited thereto. The aforementioned description may be applied to any touch-screen panel including the second protective film 25 having a second protrusion portions pp1_1 to pp1_x. For example, the aforementioned description may also be applied in the case that the display device 1 includes an embedded type touch-screen panel having the second protective film 25.

Figure 7:
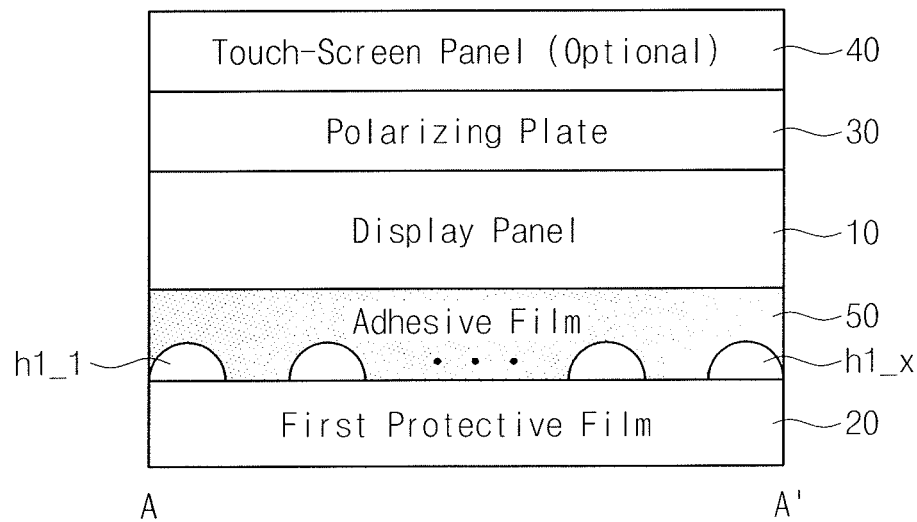
FIG. 7 illustrates a schematic cross-sectional view of a display device including an adhesive film having three-dimensionally-shaped grooves according to an exemplary embodiment.

FIG. 7 illustrates a cross-sectional view of a display device including an adhesive film having three-dimensionally-shaped grooves according to an exemplary embodiment.

Referring to FIG. 7, the display device 1 may further include an adhesive film 50 for attaching the display panel 10 and the first protective film 20. The adhesive film 50 may include silicone, urethane, acryl, etc., and may further include nanoparticles including silicon dioxide, aluminum, etc. The thickness of the adhesive film 50 may be about 5 to about 50 μm, but is not limited thereto.

A plurality of grooves h1_1 to h1_x may be formed on at least one surface of the upper and lower surfaces of the adhesive film 50. The plurality of grooves h1_1 to h1_x may perform the same function as those of the first and second protrusion portions p1_1 to p10_7 and pp1_1 to pp1_x. Therefore, the aforementioned descriptions about the first and second protective films 20 and 25 may also be applied to the adhesive film 50 having a plurality of grooves.

For example, the plurality of grooves h1_1 to h1_x are formed on the adhesive film 50 to be arranged in first and second directions parallel to the first and second bending axes D1 and D2, respectively. In addition, the plurality of grooves h1_1 to h1_x may have one three-dimensional shape from among a sphere, a semi-sphere, a rectangular cylinder, a triangular cylinder, a circular cylinder, a triangular pyramid, a cone and a hexagonal pyramid.

The plurality of grooves h1_1 to h1_x formed on the adhesive film 50 may alleviate stress exerted on the display panel 10 and prevent creases which may be formed on the surface of the display panel 10. The adhesive film 50 having the grooves h1_1 to h1_x may be disposed on the first protective film 20 instead of the protrusion portions p1_1 to p10_7. Also, the adhesive film 50 having the grooves h1_1 to h1_x may be further included in the other surface of the first protective film 20 having the first protrusion portions p1_1 to p10_7.

While embodiments have been described with reference to each of the drawings for convenience of description, a new embodiment may be implemented by combining the embodiments illustrated in the drawings. In addition, designing a recording medium readable by a computer having a recorded program for implementation of the previously described embodiments according to necessity of those skilled in the art is also within the scope of this specification.

The configurations and methods according to the above-described embodiments will not be applicable in a limited way to the display device, and all or parts of the embodiments may be selectively combined and configured to make various modifications thereto.

By way of summation and review, when a display panel of a display device, e.g., an organic light-emitting display device, is constructed, there are limitations in terms of portability of large screen displays that use glass substrate, i.e., which are heavy and easily broken. Therefore, there has recently been developed an organic light-emitting display device in which a flexible plastic substrate, which is light-weight and may have varied shapes, is used as a substrate of a display panel. As a result, the shapes of display panels have become freely deformable.

However, when the shape of a display panel included in an organic light-emitting display device is deformed, elements included in the display panel may be damaged by an external force exerted on the display panel, or a surface of the display panel may be roughened, e.g., scratched, so as to interfere with the user's view of a displaying screen. Therefore, according to embodiments, a display panel includes an internal structure of the display panel so that stress exerted on the display panel may be alleviated and the surface of the display panel may maintain smoothness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display panel having a dome shape simultaneously bent upward with respect to a first bending axis and a second bending axis such that the dome shape projects upward, and the first and second bending axes intersect with each other, and the display panel comprising a display surface emitting light upward and an opposite surface which is opposite to the display surface;
a first protective layer comprising a plurality of first protrusion portions and disposed on a lower surface of the display panel; and
an adhesive layer disposed between the display panel and the first protective layer, wherein
the adhesive layer includes a plurality of grooves,
the plurality of grooves are arranged in a first direction parallel to the first bending axis and in a second direction parallel to the second bending axis, and
the plurality of first protrusion portions are arranged in the first direction and the second direction, a predetermined vacant space is formed between the plurality of first protrusion portions,
in the state where the display panel is bent with respect to the first bending axis and the second bending axis, the plurality of first protrusion portions converge to the vacant space.

2. The display device as claimed in claim 1, wherein the grooves are on at least one surface of an upper surface and a lower surface of the adhesive layer.

3. The display device as claimed in claim 1, wherein the grooves have shape of one of a sphere, a semi-sphere, a rectangular cylinder, a triangular cylinder, a circular cylinder, a triangular pyramid, a cone, and a hexagonal pyramid.

4. The display device as claimed in claim 1, wherein
the plurality of first protrusion portions forms a plurality of rows and a plurality of columns, each of the first protrusion portions has three-dimensional shape.

5. The display device as claimed in claim 4, wherein the adhesive layer is disposed between the display panel and an upper surface of the first protective layer, the plurality of first protrusion portions are formed on a lower surface of the first protective layer.

6. The display device as claimed in claim 5, wherein:
the lower surface of the first protective layer is exposed between bases of the first protrusion portions.

7. The display device as claimed in claim 4, wherein:
the first protrusion portions have a structure obtained by imprinting using a mold substrate having a plurality of embossed grooves corresponding to the first protrusion portions, and the three-dimensional shape of the first protrusion portions is a sphere, a semi-sphere, a rectangular cylinder, a triangular cylinder, a circular cylinder, a triangular pyramid, a cone, or a hexagonal pyramid.

8. The display device as claimed in claim 4, wherein:
the first protective layer includes a first material that include polyethylenetherephthalate (PET), polyethylenenaphthalate, polycarbonate, polyarylate, polyetherimide, polyethersulphone, or polyimide, the first protrusion portions are formed by imprinting a second material that includes polyethylenetherephthalate (PET), polyethylenenaphthalate, polycarbonate, polyarylate, polyetherimide, polyethersulphone, or polyimide using a mold substrate having a plurality of embossed grooves corresponding to the first protrusion, and
the first material used for the first protective layer is different from the second material used for the first protrusion portions.

9. The display device as claimed in claim 1, wherein the display panel includes an organic light-emitting element.

10. The display device as claimed in claim 1, further comprising a sensing panel which includes a second protective layer having second protrusion portions having three-dimensional shapes.

11. The display device as claimed in claim 10, wherein the second protrusion portions are on at least one of an upper surface and a lower surface of the second protective layer.

12. The display device as claimed in claim 10, wherein the second protrusion portions are arranged in the first direction parallel to the first bending axis and the second direction parallel to the second bending axis.

13. The display device as claimed in claim 10, wherein the three-dimensional shape of the second protrusion portions is one of a sphere, a semi-sphere, a rectangular cylinder, a triangular cylinder, a circular cylinder, a triangular pyramid, a cone, and a hexagonal pyramid.

14. A display device, comprising:
a display panel having a curved shape bent with respect to a bending axis and the display panel comprising a display surface emitting light upward and an opposite surface which is opposite to the display surface;
a polarizing layer on an upper surface of the display panel;

a sensing panel on an upper surface of the polarizing layer and sensing an input;
a first protective layer on a lower surface of the display panel;
an adhesive layer disposed between the display panel and the first protective layer; and
a second protective layer comprising a plurality of second protrusion portions and disposed between the sensing panel and the polarizing layer, wherein
the adhesive layer includes a plurality of grooves,
the plurality of grooves are arranged in a first direction parallel to the bending axis,
the plurality of second protrusion portions are arranged in the first direction, a predetermined vacant space is formed between the plurality of second protrusion portions,
in the state where the display panel is bent with respect to the bending axis, the plurality of second protrusion portions converge to the vacant space.

15. The display device as claimed in claim 14, wherein the grooves are on at least one surface of an upper surface and a lower surface of the adhesive layer.

16. The display device as claimed in claim 14, wherein the grooves are shape of one of a sphere, a semi-sphere, a rectangular cylinder, a triangular cylinder, a circular cylinder, a triangular pyramid, a cone, and a hexagonal pyramid.

17. The display device as claimed in claim 14, wherein the first protective layer comprises a plurality of first protrusion portions, and
the plurality of first protrusion portions are arranged in the first direction parallel to the bending axis.

18. The display device as claimed in claim 17, wherein the adhesive layer is disposed between the display panel and an upper surface of the protective layer, the plurality of first protrusion portions are formed on a lower surface of the protective layer.

* * * * *